(12) United States Patent  (10) Patent No.: US 9,129,913 B2
Lee  (45) Date of Patent: Sep. 8, 2015

(54) FORMATION OF BARRIER LAYER ON DEVICE USING ATOMIC LAYER DEPOSITION

(75) Inventor: Sang In Lee, Sunnyvale, CA (US)

(73) Assignee: Veeco ALD Inc., Fremont, CA (US)

( * ) Notice: Subject to any disclaimer, the term of this patent is extended or adjusted under 35 U.S.C. 154(b) by 817 days.

(21) Appl. No.: 13/276,221

(22) Filed: Oct. 18, 2011

(65) Prior Publication Data

US 2012/0098146 A1 Apr. 26, 2012

Related U.S. Application Data

(60) Provisional application No. 61/405,395, filed on Oct. 21, 2010.

(51) Int. Cl.
*H01L 23/31* (2006.01)
*C23C 16/04* (2006.01)
*C23C 16/455* (2006.01)

(52) U.S. Cl.
CPC .......... *H01L 23/3192* (2013.01); *C23C 16/042* (2013.01); *C23C 16/45551* (2013.01); *H01L 2924/0002* (2013.01)

(58) Field of Classification Search
CPC .... C23C 16/04; C23C 16/042; H01L 23/3192
See application file for complete search history.

(56) References Cited

U.S. PATENT DOCUMENTS

| | | | |
|---|---|---|---|
| 6,213,478 B1 | 4/2001 | Nishikawa | |
| 2006/0148241 A1 | 7/2006 | Brody et al. | |
| 2007/0163497 A1* | 7/2007 | Grace et al. | 118/715 |
| 2008/0295962 A1* | 12/2008 | Endo et al. | 156/345.23 |
| 2009/0081842 A1* | 3/2009 | Nelson et al. | 438/289 |
| 2009/0165715 A1 | 7/2009 | Oh | |
| 2010/0068413 A1 | 3/2010 | Lee | |

OTHER PUBLICATIONS

PCT International Search Report and Written Opinion, PCT Application No. PCT/US2011/056785, Mar. 2, 2012, 10 pages.

* cited by examiner

*Primary Examiner* — Joel Horning
(74) *Attorney, Agent, or Firm* — Fenwick & West LLP

(57) ABSTRACT

The configuration of one or more barrier layers for encapsulating a device is controlled by setting parameters of atomic layer deposition (ALD). A substrate formed with the device is placed on a susceptor and exposed to multiple cycles of source precursor gas and reactant precursor gas injected by reactors of a deposition device. By adjusting one or more of (i) the relative speed between the susceptor and the reactors, (ii) configuration of the reactors, and (iii) flow rates of the gases injected by the reactors, the configuration of the layers deposited on the device can be controlled. By controlling the configuration of the deposited layers, defects in the deposited layers can be prevented or reduced.

8 Claims, 6 Drawing Sheets

FORMATION OF BARRIER LAYER ON DEVICE USING ATOMIC LAYER DEPOSITION

CROSS-REFERENCE TO RELATED APPLICATION

This application claims priority under 35 U.S.C. §119(e) to co-pending U.S. Provisional Patent Application No. 61/405,395, filed on Oct. 21, 2010, which is incorporated by reference herein in its entirety.

BACKGROUND

1. Field of Art

The present invention relates to depositing one or more layers of barrier materials on a substrate using atomic layer deposition (ALD).

2. Description of the Related Art

Some devices (e.g., integrated circuits) are sensitive to elements such as moisture and oxygen present in atmosphere. In order to protect such devices, the devices are often encapsulated in layers of barrier materials during the fabrication process. The layers are generally formed over the devices and extend over the edges of the devices to prevent such elements from coming into contact with the devices. The films are often formed using methods such as sputtering or chemical vapor deposition (CVD). One example of such barrier layer is aluminum oxide ($Al_2O_3$).

Figure (FIG. 1 is a cross sectional diagram illustrating a device 136 encapsulated in two barrier layers 124, 132, and an intermediate layer 128 between the two barrier layers. The intermediate layer 128 may, for example, serve to flatten the vertical profile of the device 136 and barrier layers 124, 132 deposited thereon. During the deposition of the barrier layers 124, 132 and the intermediate layer 128, a shadow mask 110 is placed on a substrate 120. The shadow mask 110 has openings so that the areas to be deposited with barrier layers 124, 132 and the intermediate layer 238 are exposed. Since materials for deposition are injected vertically into the opening of the shadow mask 110, the barrier layers 124, 132 and the intermediate layer 128 extend generally to the same horizontal edges 130.

As illustrated, the intermediate layer 128 and the barrier layer 124 do not extend beyond the barrier layer 132. The moisture or oxygen can penetrate the layers 124, 132 at the edges 130 since the coverage of the layers 124, 132 is incomplete at the edges 130. Hence, the barrier layers 124, 132 formed on the device 136 may provide inadequate shielding against atmospheric elements. Moreover, if the barrier layers extend over to the shadow mask 110, the barrier layers 124, 132 may come in contact with the shadow mask 110 and can be ruptured or torn apart when the shadow mask 110 is removed from the substrate 120.

Barrier layers formed by conventional deposition methods are also vulnerable to other defects. FIG. 2 is an example of a device 234 with a transparent electrode 230 covering part of the device 234. An electrode 238 extends from the transparent electrode 230 for connecting a device 234 to an external device (not shown). For example, the transparent electrode 230 is made of indium tin oxide (ITO) and the electrode 238 is made of aluminum (Al). In such example, the device 234 and the transparent electrode 230 is covered entirely by barrier layers 252, 260 and an intermediate layer 256, whereas the electrode 238 is partially covered by the barrier layers 252, 260 and the intermediate layer 256. The intermediate layer 256 may be a polymer layer or a decoupling layer, deposited to flatten the vertical profile of the device 234 and other layers deposited thereon.

When depositing the barrier layers 252, 260 on the device 234 by sputtering or CVD, one or more of the barrier layers (e.g., the third layer 260) may have insufficient thickness at the vertical slope as shown in circle 222. Such barrier layers may provide insufficient protection against moisture or oxygen at these edges. Further, one or more of the barrier layers (e.g., the third layer 260) may have insufficient horizontal coverage at the edges, allowing moisture or oxygen to seep through the interfaces (as shown in circles 218 and 226) and come in contact with the device 234. Another defect may be caused during the removal of the shadow mask 110. That is, the removal of the shadow mask 110 may cause the barrier layers to be delaminated and torn apart as shown in circle 214. Finally, barrier layers formed by sputtering or CVD may suffer cracks that may extend through the thickness of a barrier layer as shown in circle 210.

SUMMARY

Embodiments relate to depositing at least a barrier layer on a device and a substrate using an atomic layer deposition (ALD). The device is placed on the substrate and a shadow mask placed between the device and one or more reactors. The substrate moves relative to one or more reactors, causing the one or more reactors to inject a source precursor onto the device and the substrate. The injected source precursor is diffused into a clearance between the substrate and the shadow mask. The injected or diffused source precursor becomes absorbed on the surface of the substrate in an exposed area and part of the surface in the clearance. The substrate move further relative to the one or more reactors, causing the one or more reactors to inject a reactant precursor onto the device and the substrate. The injected reactant precursor is also diffused into the clearance. The injected reactant replaces or reacts with the source precursor and deposits a layer of first material on part of the substrate and the device exposed to the source precursor and the reactor precursor.

In one embodiment, a purge gas is injected onto the substrate and the device by the one or more reactors between the injection of the source precursor and the reactant precursor to remove physisorbed source precursor from the surface of the device and the substrate while retaining chemisorbed source precursor on the surface of the device and the substrate.

In one embodiment, the substrate moves with the same speed across the one or more reactors while being injected with the source precursor and the reactant precursor.

In one embodiment, the substrate moves linearly with respect to the one or more reactors.

In one embodiment, the relative movements of the substrate across the one or more reactors and injection of the source precursor and the reactant precursor are repeated for a predetermined number of times to obtain the layer of the first material of a desired thickness.

In one embodiment, after depositing the layer of first material on the substrate and the device, a layer of second material is deposited on the substrate and the device by configuring the one or more reactors to inject another source precursor and another reactant precursor. The substrate and the shadow mask are injected with the other source precursor and the other reactant precursor as the substrate moves further across the one or more reactors. The other source precursor and the other reactant precursor may diffuse into the clearance between the shadow mask and the substrate. The reactant precursor reacts with or replaces the source precursor remaining on the device and the exposed portion of the substrate, depositing a layer of second material on the device and the exposed portion of the substrate. As the reactant precursor diffuses into the clearance between the substrate and the shadow mask, the reactant precursor reacts or replaces the source precursor and deposits the layer of second material on a portion of the substrate below the shadow mask.

In one embodiment, the relative movement between the substrate and the one or more reactors, and injection of the other source precursor and the other reactant precursor are repeated for a number of times to deposit a layer of second material of a desired thickness.

In one embodiment, the source precursor and the reactant precursor are injected by the one or more reactors during a first time while the other source precursor and the other reactant precursor are injected during a second time. The speed of the relative movement during the first time is different from the speed of the relative movement during the second time.

In one embodiment, the layer of the first material extends into the clearance with a first length. The layer of the second material extends into the clearance to a second length different from the first length.

In one embodiment, the substrate passes below the one or more reactors during the relative movements.

In one embodiment, the substrate and the shadow mask are placed at a pressure at or above 100 mTorr when the source precursor and the reactant precursor are injected.

DETAILED DESCRIPTION OF EMBODIMENTS

Figure 1:
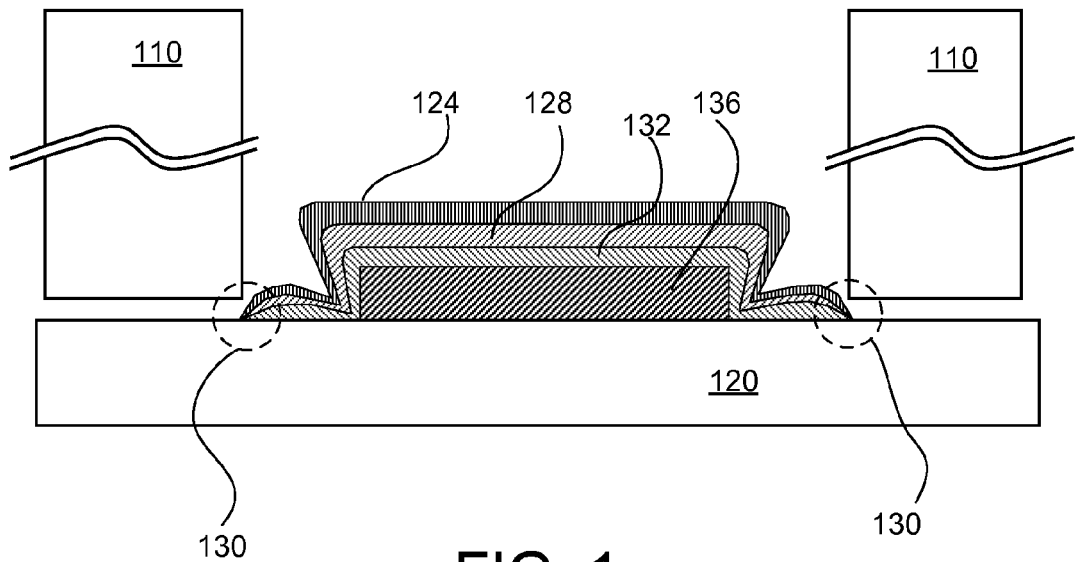
FIG. 1 is a cross sectional diagram of a device with barrier layers deposited using a conventional technique.

Embodiments are described herein with reference to the accompanying drawings. Principles disclosed herein may, however, be embodied in many different forms and should not be construed as being limited to the embodiments set forth herein. In the description, details of well-known features and techniques may be omitted to avoid unnecessarily obscuring the features of the embodiments.

In the drawings, like reference numerals in the drawings denote like elements. The shape, size and regions, and the like, of the drawing may be exaggerated for clarity.

Embodiments relate to depositing one or more barrier layers for encapsulating a device using atomic layer deposition (ALD). A substrate with the device is placed on a susceptor and exposed to multiple cycles of source precursor and reactant precursor injected by reactors of a deposition device. By adjusting one or more of (i) the relative speed between the susceptor and the reactors, (ii) configuration of the reactors, and (iii) flow rates of the gases injected by the reactors, the configuration of the layers deposited on the device can be controlled. By controlling the configuration of the deposited layers, defects in the deposited layers can be prevented or reduced.

An atomic layer deposition (ALD) is a thin film deposition technique for depositing one or more layers of material on a substrate. ALD uses two types of chemical, one is a source precursor and the other is a reactant precursor. Generally, ALD includes four stages: (i) injection of a source precursor, (ii) removal of a physical adsorption layer of the source precursor, (iii) injection of a reactant precursor, and (iv) removal of a physical adsorption layer of the reactant precursor. ALD can be a slow process that can take an extended amount of time or many repetitions before a layer of desired thickness can be obtained. Hence, to expedite the process, a vapor deposition reactor with a unit module (so-called a linear injector), as described in U.S. Patent Application Publication No. 2009/0165715 or other similar devices may be used to expedite ALD process. The unit module includes an injection unit and an exhaust unit for a source material (a source module), and an injection unit and an exhaust unit for a reactant material (a reactant module).

An ALD vapor deposition chamber has one or more sets of reactors for depositing ALD layers on substrates. As the substrate passes below the reactors, the substrate is sequentially exposed to the source precursor, a purge gas and the reactant precursor. The source precursor molecules deposited on the substrate reacts with reactant precursor molecules or the source precursor molecules are replaced with the reactant precursor molecules to deposit a layer of material on the substrate. After exposing the substrate to the source precursor or the reactant precursor, the substrate may be exposed to the purge gas to remove excess source precursor molecules or reactant precursor molecules from the substrate.

Figure 3A:
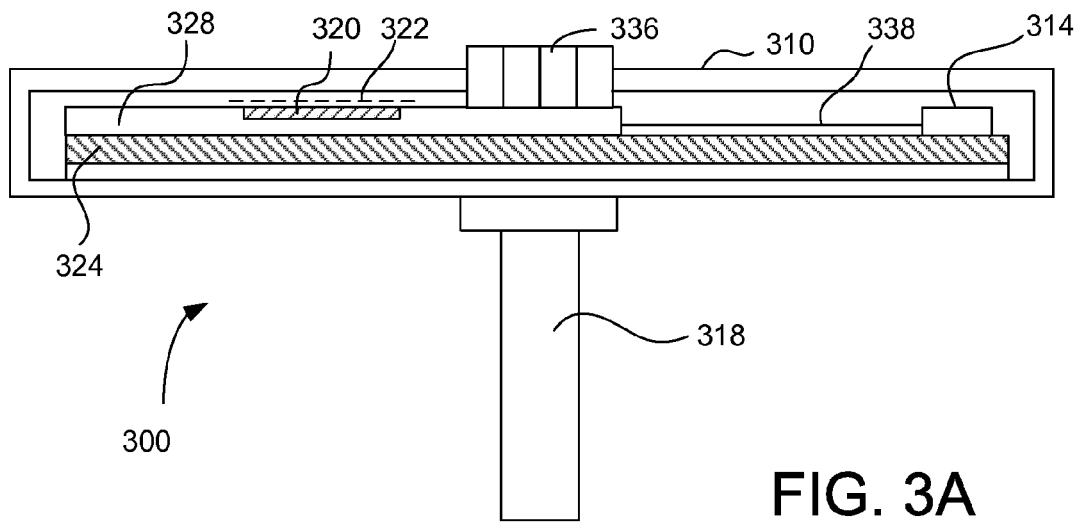
FIG. 3A is a cross sectional diagram of a linear deposition device, according to one embodiment.
Figure 3B:
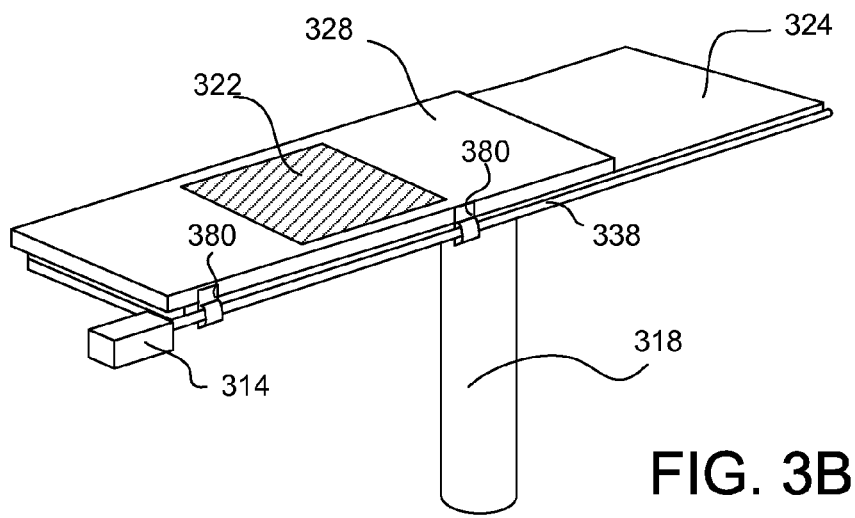
FIG. 3B is a perspective view of a linear deposition device, according to one embodiment.

FIG. 3A is a cross sectional diagram of a linear deposition device 300, according to one embodiment. FIG. 3B is a perspective view of the linear deposition device 300 (without chamber walls to facilitate explanation), according to one embodiment. The linear deposition device 300 may include, among other components, a support pillar 318, process chamber walls 310 and one or more reactors 336. The reactors 336 may include one or more of injectors and radical reactors, as described below in detail with reference to FIGS. 4 and 5. Each of the injector modules injects a source precursor, a reactant precursor, a purge gas or a combination of these materials onto the substrate 320.

The process chamber enclosed by the walls 310 may be maintained in a vacuum state to prevent contaminants from affecting the deposition process and to enhance deposition process. The process chamber contains a susceptor 328 which receives a substrate 320. The susceptor 328 is placed on a support plate 324 for a sliding movement. The support plate 324 may include a temperature controller (e.g., a heater or a cooler) to control the temperature of the substrate 320. A shadow mask 322 is attached to the susceptor 328 using, for example, magnets (not shown). The shadow mask 322 is placed on the substrate 320 to expose certain portions of the substrate 320 to gases or radicals injected by the reactors 336. The deposition device 300 may also include lift pins (not shown) that facilitate loading of the substrate 320 onto the susceptor 328 or dismounting of the substrate 320 from the susceptor 328.

In one embodiment, the susceptor 328 is secured to brackets 380 that move across an extended bar 338 with screws formed thereon. The brackets 380 have corresponding screws formed in their holes receiving the extended bar 338. The extended bar 338 is secured to a spindle of a motor 314, and hence, the extended bar 338 rotates as the spindle of the motor 314 rotates. The rotation of the extended bar 338 causes the brackets 380 (and therefore the susceptor 328) to make a linear movement on the support plate 324. By controlling the speed and rotation direction of the motor 314, the speed and direction of the linear movement of the susceptor 328 can be controlled.

The use of a motor 314 and the extended bar 338 is merely an example of a mechanism for moving the susceptor 328. Various other ways of moving the susceptor 328 (e.g., use of gears and pinion at the bottom, top or side of the susceptor 128). Moreover, instead of moving the susceptor 328, the susceptor 328 may remain stationary and the reactors 336 may be moved.

The linear deposition device 300 is merely illustrative. Instead of using the linear deposition device 300, a rotating deposition device may be used. The rotating deposition device has a susceptor and reactors that rotate with respect to each other. Substrates are mounted on the susceptor. For example, the susceptor may be fixed to a spindle that rotates the susceptor relative to the reactors. As the spindle and the susceptor rotates, the substrates pass below the reactors and are sequentially exposed to different gases and radicals.

Figure 4:
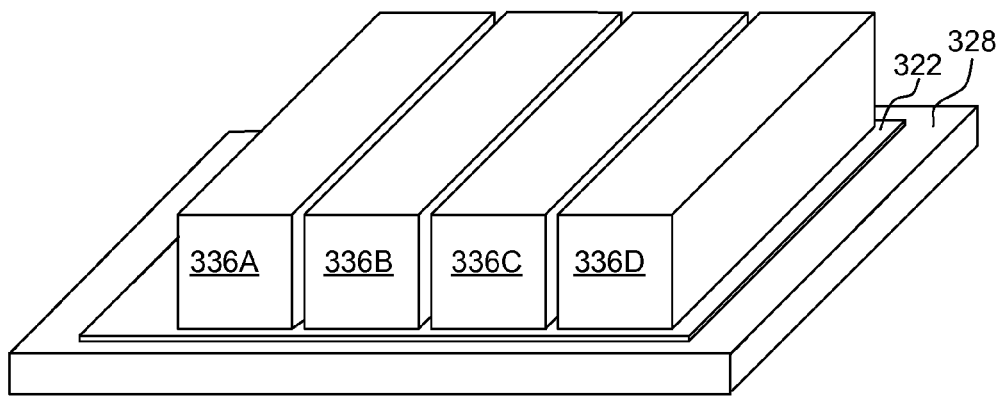
FIG. 4 is a perspective view of reactors in the linear deposition device, according to one embodiment.

FIG. 4 is a perspective view of the reactors 336, according to one embodiment. The reactors 336 include four separate reactors 336. By increasing the number of reactors, the substrate 320 (below the shadow mask 322) may undergo an additional number of processes per cycle, thereby increasing the speed of the process. The reactors 336A through 336D are placed above the shadow mask 322. As the susceptor 328 moves, the shadow mask 322 and the substrate 302 between the substrate 320 and the shadow mask 322 also moves below the reactors 336A through 336D. As a consequence, the shadow mask 322 and the substrate 320 are sequentially exposed to gases and radicals injected by the reactors 336A through 336D. The reactors 336A through 336D may have the same configuration or different configurations.

Figure 5:
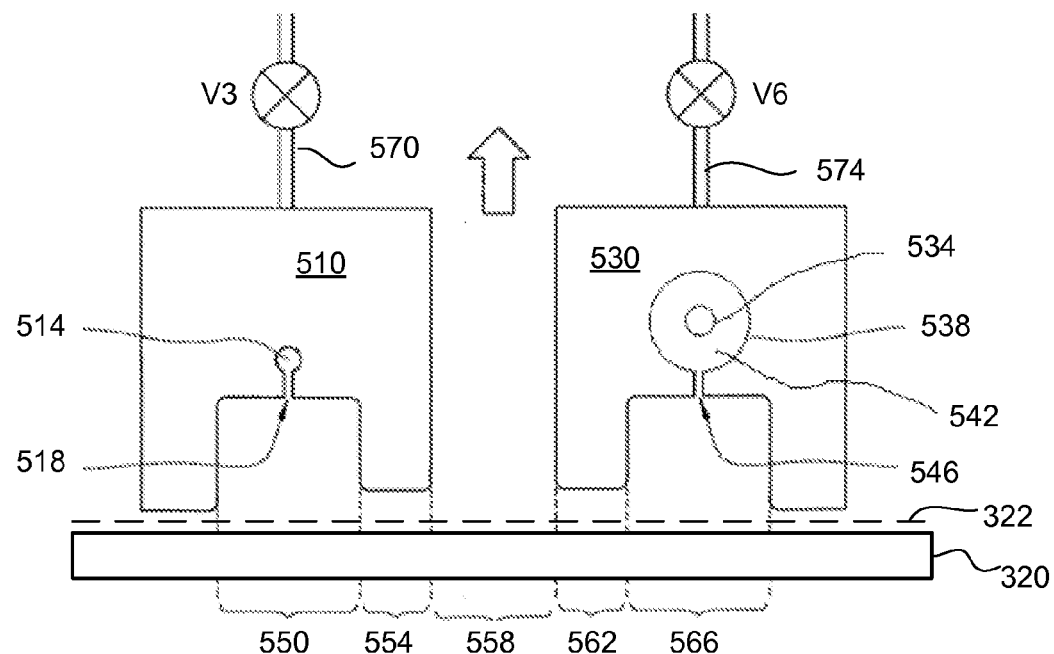
FIG. 5 is a conceptual diagram of a reactor according to one embodiment.

FIG. 5 is a cross sectional diagram illustrating a reactor, according to one embodiment. The reactor may include, among other components, an injector 510 and a radical reactor 530. The injector 510 received gas via a valve V3 and a pipe 570. The valve V3 may be adjusted to control the rate of gas flow into the injector 510. The injector 510 has a channel 514 and holes 518 formed in its body. The gas received via the pipe 570 flows through the channel 514 and the holes 518 into a chamber 550. The injected gas comes into contact with the shadow mask 322 and the substrate 320 in the chamber 550, passes through the constriction zone 554 and is discharged through an outlet 558. The gas injected to the injector 510 may be a source precursor, a reactant precursor or a purge gas.

The radical reactor 530 receives gas via valve V6 and a pipe 574. The gas is fed into a cavity 542 connected to the pipe 574. The radical reactor 530 may include, among other components, an inner electrode 534 and an outer electrode 538. Voltage is applied across the inner electrode 534 and the outer electrode 538, generating plasma in the cavity 542 which in turn generates radicals of the gas. The radicals are then injected via holes 546 into a chamber 566. In the chamber 566, the radicals come into contact with the shadow mask 322 and the substrate 320, and are discharged to the outlet 558 via a constriction zone 562.

The reactor of FIG. 5 is merely an example. Reactors of various other configurations may be used. For example, some reactors may include only injectors whereas others may include only radical reactors. Further, outlets and constriction zones may be provided at right or left ends instead of having an outlet between an injector and a radical reactor.

Figure 6:
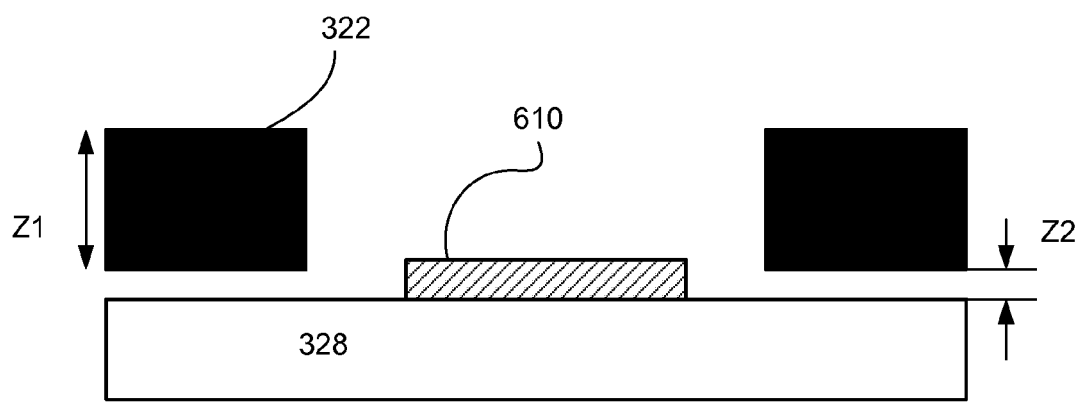
FIG. 6 is a cross sectional diagram of a device on a substrate for depositing one or more barrier layers, according to one embodiment.

FIG. 6 is a cross sectional diagram illustrating a device 610 and a shadow mask 322 on a substrate 328, according to one embodiment. In one embodiment, the shadow mask 322 is made of stainless steel or Invar steel. The thickness Z1 of the shadow mask 322 may be around 0.1 to 0.2 mm. Even though the shadow mask 322 is placed on top of the substrate 328, a clearance Z2 exists between the shadow mask and the substrate 328 due to various surface irregularities of the shadow mask 322 and/or the substrate 328. The clearance Z1 generally ranges from a few microns to tens of microns. As described below in detail with reference to FIGS. 7A through 7C, the source precursor and the reactant precursor may flow into the clearance and deposit layers in the clearance.

Figure 7A:
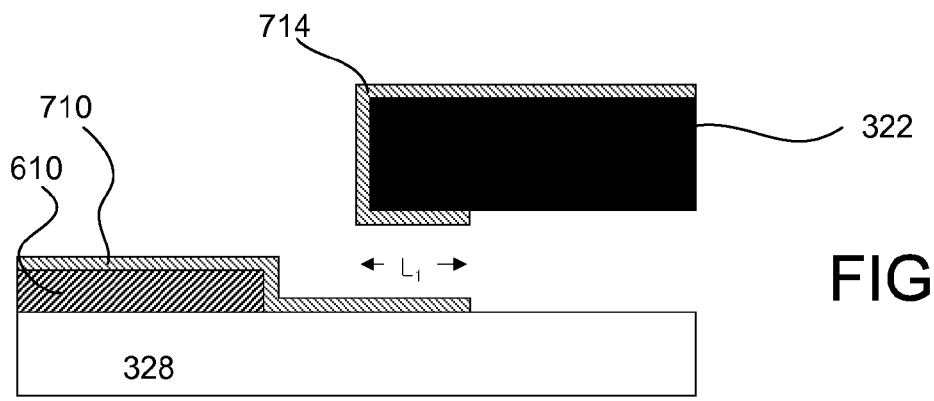
FIGS. 7A through 7C are cross sectional diagrams illustrating depositing of layers on a device, according to one embodiment.
Figure 7B:
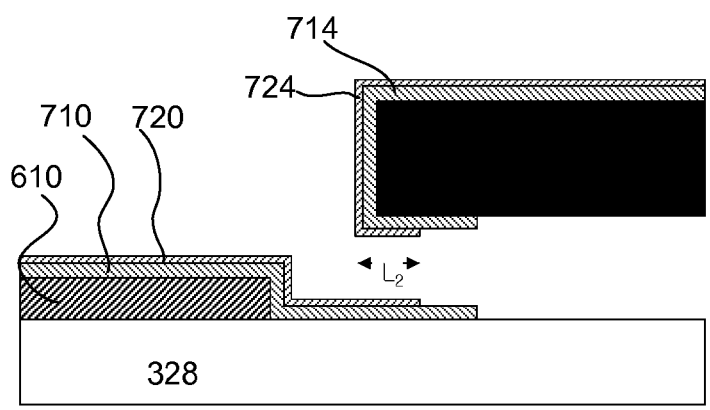
Figure 7C:
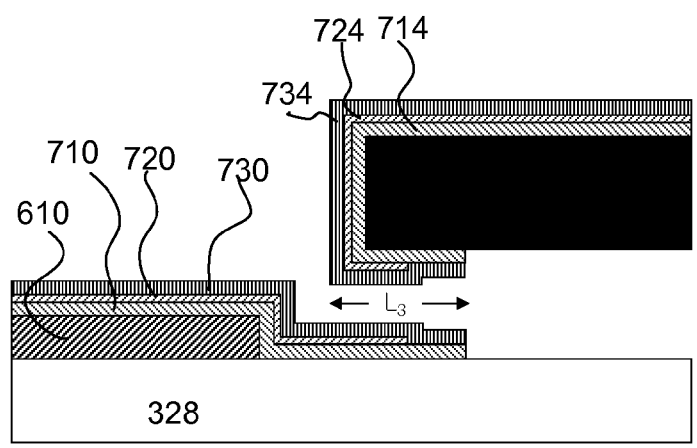

FIGS. 7A through 7C are cross sectional diagrams illustrating the process of depositing layers on the device 610 and the substrate 328, according to one embodiment. The reactors 336 are configured to inject source precursor gas and reactant precursor gas on the substrate 328 and the shadow mask 322. A purge gas (e.g., Ar gas) or radicals of inert gas may be injected before or after the injection of the precursor gases to improve various aspects of the atomic layer deposition process. As the number of reactors is increased, a thicker layer can be obtained in one cycle (i.e., a movement from the left to the right of the reactors and reverting to the left end position).

Figure 2:
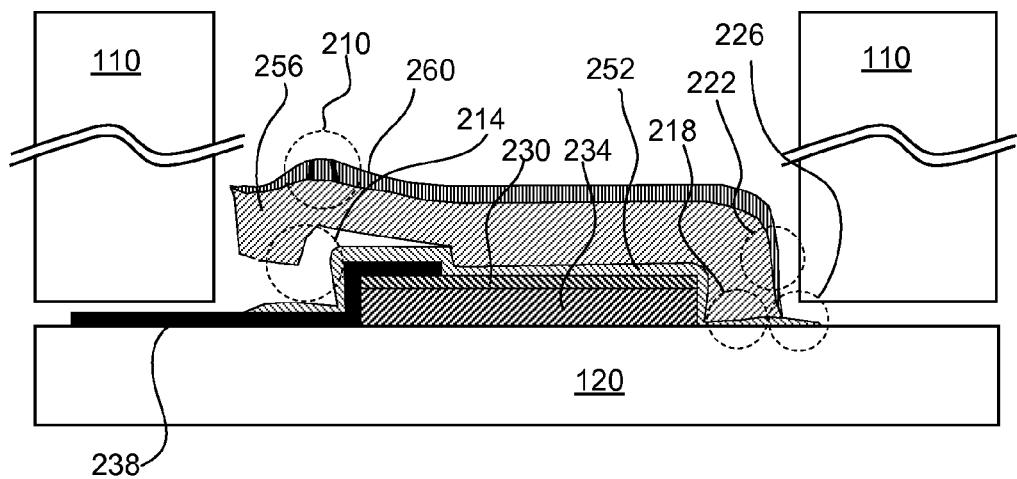
FIG. 2 is a cross sectional diagram of a device with an electrode covered with barrier layers using a conventional technique.

When a deposition process is performed in a high vacuum state at a pressure range of $10^{-16}$ to $10^{-8}$ Torr, the gases have a long mean free path. Under such vacuum state, the injected materials generally travel along a straight path before coming into contact with the device 610 or the substrate 328. Hence, the layers deposited on the device and substrate tend to have the profile where the layers do not extend into the clearance between the shadow mask 110 and the substrate 120, as described above with reference to FIGS. 1 and 2. However, when the pressure for the deposition process is increased to around 100 mTorr or more (for example, up to several Torrs), the mean free path of injected materials become shorter. Hence, the gases tend to diffuse into the clearance between the substrate 120 and the lower surfaces of the shadow mask 322, forming deposited layers at these locations (as shown in FIG. 7A).

The lateral length $L_1$ of the deposited layers may change depending on the duration of time that the substrate 328 and the shadow mask 322 are exposed to the deposition gas, the flow rate of the source precursors and/or reactant precursors, and the configuration of the reactors (e.g., the vertical distance between the reactors and the substrate). Hence, by controlling these parameters, the lateral length $L_1$ of the deposited layer can be adjusted. In one embodiment, length $L_1$ is about 10 microns to 300 microns. By using ALD and controlling these parameters, the barrier layers and other layers on the device can have configurations as desired. The longer the substrate 328 is exposed to the source precursor and/or the reactant precursor, the longer length $L_1$ is likely to become due to extensive diffusion of the source precursor and/or the reactant precursor into the clearance.

The shadow mask 322 is also injected with the source precursor and the reactant precursor. Hence, a layer 714 of material is also deposited on the shadow mask 322.

A single passing of the substrate 328 below a series of reactors 336 may be deposit an insufficient layer of barrier material. Hence, the substrate 328 passes below the series of reactors 336 for a predetermined number of times to obtain a barrier layer of a desired thickness.

FIG. 7B is a cross sectional diagram illustrating the depositing of a second layer 720 on the device 610 and the substrate 328, according to one embodiment. After depositing the first layer 710, the reactors 336 are reconfigured to inject a different source precursor and a different reactor precursor for depositing the second layer 720. In one embodiment, the moving speed of the susceptor 328 or other parameters for ALD process are also adjusted so that the source precursor and the reactant precursor diffuse into the clearance for distance $L_2$. The shadow mask 322 is also deposited with a second layer 724.

FIG. 7C is a cross sectional diagram illustrating the depositing of a third layer 730 on the device 610 and the substrate 328, according to one embodiment. After depositing the second layer 720 on the substrate 328 and the device 610, the reactors 336 are reconfigured to inject a source precursor and a reactor precursor for depositing the third layer 730. In one embodiment, the moving speed of the susceptor 328 or other parameters for ALD process are also adjusted so that the source precursor and the reactant precursor for depositing the third layer 730 diffuse into the clearance for distance $L_3$. The shadow mask 322 is also deposited with a third layer 734.

In one embodiment, the first layer 710 deposited on the device 610 is aluminum oxide ($Al_2O_3$), the second layer 720 is aluminum (Al), and the third layer 730 is aluminum nitride (AlN) or Zirconium dioxide ($ZrO_2$). To deposit the first layer 720, trimethylaluminum (TMA) gas is used as the source precursor and oxygen radicals (O*) are used as the reactant precursor. The radicals tend to have a short lifespan. Hence, the amount and time for injecting the oxygen radicals should be sufficient to reach and extend into the clearance between the shadow mask and the substrate. To deposit aluminum nitride, TMA gas is used as the source precursor and $NH_3$ plasma or nitrogen with Argon gas is used as the reactant precursor. To deposit Zirconium dioxide, tetraethylmethylaminozirconium (TEMAZr) may be used as a source precursor. Gases or radicals for depositing these materials are well known, and hence, the detailed description is omitted for the sake of brevity. Various other materials may be used as the first layer, the second layer and the third layer. Furthermore, more or fewer layers of materials may be deposited on the device and the substrate.

Figure 8:
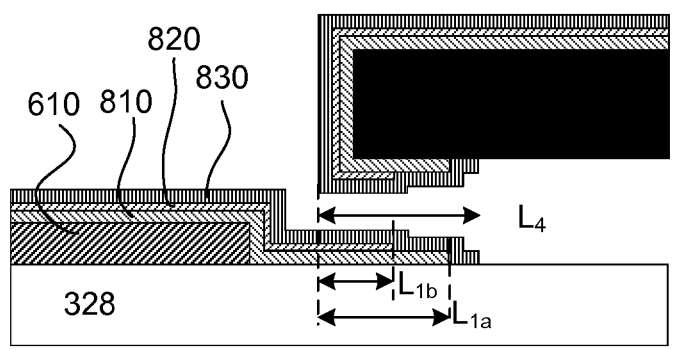
FIG. 8 is a cross sectional diagram illustrating a device deposited with barrier layers of a configuration, according to one embodiment.

FIG. 8 is a cross sectional diagram of the device 610 and the substrate 328 deposited with three layers of materials, according to another embodiment. In this embodiment, the first layer 810 extends into the clearance for a length $L_{1a}$, the second layer 820 extends into the clearance for a length of $L_{1b}$, and the third layer 830 extends into the clearance for a length $L_4$ (where $L_{1b} < L_{1a} < L_4$). In one embodiment, the length $L_4$ is around 20 microns to 500 microns.

Figure 9:
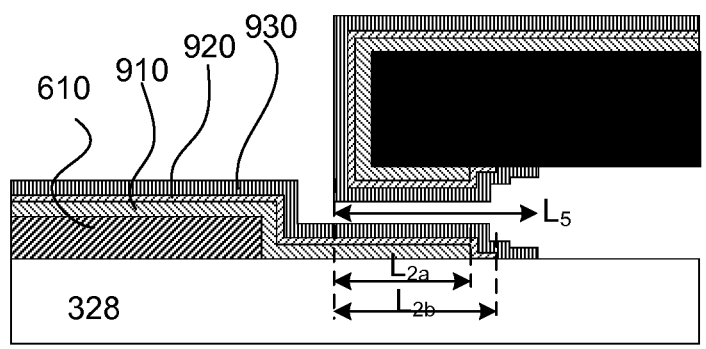
FIG. 9 is a cross sectional diagram illustrating a device deposited with barrier layers in another configuration, according to one embodiment.

FIG. 9 is a cross sectional diagram of the device 610 and the substrate 328 deposited with three layers of materials, according to another embodiment. In this embodiment, the first layer 910 extends into the clearance for a length $L_{2a}$, the second layer 920 extends into the clearance for a length of $L_{2b}$, and the third layer 830 extends into the clearance for a length $L_5$ (where $L_{2a} < L_{2b} < L_5$). In one embodiment, the first layer 910 is a first barrier layer, the second layer 920 is a stress buffer layer made of metal inorganic/organic hybrid such as Alucone, and the third layer is a second barrier layer. Alucone may be obtained by using TMA as the source precursor and Ethylene glycol as the reactant precursor.

As illustrated in FIGS. 7C, 8 and 9, by controlling the parameters associated with ALD process, the layers deposited on the device and the substrate can be controlled to have different configurations depending on the function and use of each layer. ALD process provides layers of better quality compared to sputtering or CVD, and results in layers with fewer defects. Moreover, the deposited layers extend below the shadow mask, providing better protection against oxygen or humidity.

Figure 10:
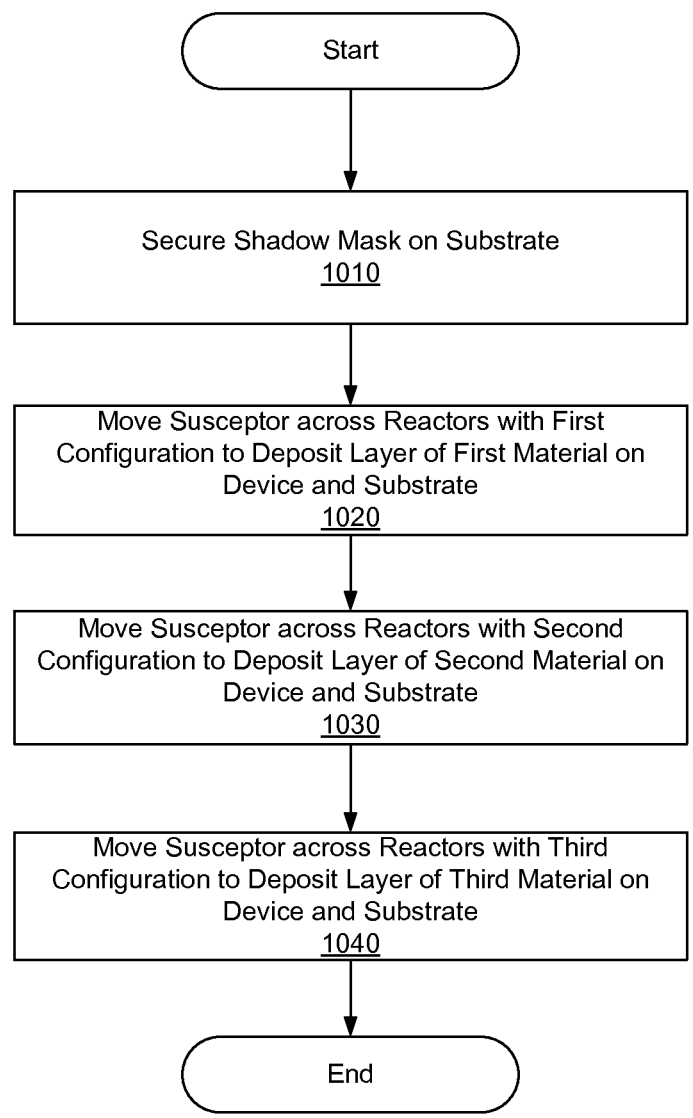
FIG. 10 is a flowchart illustrating a process for depositing barrier layers on a device, according to one embodiment.

FIG. 10 is a flowchart illustrating a process for depositing barrier layers on a device, according to one embodiment. First, the shadow mask 322 secured on the susceptor 328 over the substrate 320, using, for example, magnets. The susceptor 328 is then moved across the reactors 336 with a first configuration to deposit a first layer on the device 610. The first configuration defines, for example, the gases or radicals to be injected onto the substrate 320, flow rate of the gases and radicals onto the substrate 320, and the clearance between the substrate 320 and the reactors 336. The speed of the susceptor 328 across the reactors 336 is also controlled appropriately to allow diffusion of the gases and radicals into the clearance between the substrate and the shadow mask. The process of moving 1020 the susceptor 328 across the reactors is repeated for a number of times to obtain the first layer of a desired thickness.

After the first layer of a desired thickness is deposited, the susceptor 328 is moved 1030 across the reactors 336 with a second configuration to deposit a second layer on the first layer. The second configuration may involve, for example, the use of different gases or radicals, different flow rate of gases and radicals, and different clearance between the substrate 320 and the reactors 336, compared to the first configuration. By differing such parameters, the second layer may consist of different material compared to the first layer and extend to a different length in the clearance between the substrate and the shadow mask compared to the first layer. The process of moving 1030 across the reactors 336 with the second configuration may be repeated for a number of times to obtain the second layer of a desired thickness.

After the second layer of a desired thickness is deposited, the susceptor 328 is moved 1040 across the reactors 336 with a third configuration to deposit a third layer on the second layer. The third configuration may involve, for example, the use of different gases or radicals, different flow rate of gases and radicals, and different clearance between the substrate 320 and the reactors 336, compared to the second configuration. By differing such parameters, the third layer may consist of different material compared to the second layer and extend to a different length in the clearance between the substrate and the shadow mask compared to the second layer. The process of moving 1040 across the reactors 336 with the third configuration may be repeated for a number of times to obtain the second layer of a desired thickness.

Although FIG. 10 describes an embodiment with three different layers, more than three or less than three layers may be deposited on the device and the substrate. One or more of such layers may function as a barrier layer that prevents external elements from deteriorating the device in use while others may offer different function (e.g., flattening of the vertical profile).

The substrate fabricated using such methods can be used in various applications such as display devices or other electronic devices. Depending on the applications, various types of substrate may also be used. Example substrates include silicon wafers and glasses.

Although the present invention has been described above with respect to several embodiments, various modifications can be made within the scope of the present invention. Accordingly, the disclosure of the present invention is intended to be illustrative, but not limiting, of the scope of the invention, which is set forth in the following claims.

What is claimed is:

1. A method of depositing a layer on a substrate, comprising:
   (a) causing a first relative movement between a substrate comprising a device and one or more reactors, a shadow mask placed between the substrate and the one or more reactors;
   (b) injecting a source precursor onto the device and the substrate by the one or more reactors responsive to causing the first relative movement;
   (c) diffusing the injected source precursor into a clearance between the substrate and the shadow mask;
   (d) causing a second relative movement between the substrate and the one or more reactors;
   (e) injecting a reactant precursor onto the device and the substrate by the one or more reactors responsive to causing the second relative movement;
   (f) diffusing the injected reactant precursor to replace or react with the source precursor and deposit a layer of first material on the device and the substrate, the layer of the first material extending into the clearance for a first distance;
   (g) causing a third relative movement between a substrate and one or more reactors;
   (h) injecting another source precursor onto the device and the substrate by the one or more reactors responsive to causing the third relative movement;
   (i) diffusing the other injected source precursor into the clearance between the substrate and the shadow mask;
   (j) causing a fourth relative movement between the substrate and the one or more reactors;
   (k) injecting another reactant precursor onto the device and the substrate by the one or more reactors responsive to causing the fourth relative movement; and
   (l) diffusing the other injected reactant precursor replacing or reacting with the other source precursor to deposit a layer of second material on the device and the substrate, the layer of the second material extending into the clearance for a second distance greater than the first distance.

2. The method of claim 1, wherein a speed of the first relative movement and the second relative movement is the same.

3. The method of claim 1, wherein the first and second relative movements are linear movements.

4. The method of claim 1, further comprising repeating (a) through (l) for a predetermined number of times.

5. The method of claim 1, further comprising repeating (g) through (l) for a predetermined number of times.

6. The method of claim 1, wherein a speed of the first relative movement and a speed of the second relative movement are the same, a speed of the third relative movement and a speed of the fourth relative movement are the same, and the speed of the first and second movements is different from the speed of the third and fourth relative movements.

7. The method of claim 1, wherein the substrate passes below the one or more reactors during the first and second relative movements.

8. The method of claim 1, wherein the substrate and the shadow mask are placed at a pressure at or above 100 mTorr when the source precursor or the reactant precursor is injected.

* * * * *